United States Patent
Tian et al.

(10) Patent No.: US 6,498,336 B1
(45) Date of Patent: Dec. 24, 2002

(54) INTEGRATED LIGHT SENSORS WITH BACK REFLECTORS FOR INCREASED QUANTUM EFFICIENCY

(75) Inventors: Hui Tian, Stanford, CA (US); Ricardo Motta, Palo Alto, CA (US)

(73) Assignee: Pixim, Inc., Mountain View, CA (US)

( * ) Notice: Subject to any disclaimer, the term of this patent is extended or adjusted under 35 U.S.C. 154(b) by 42 days.

(21) Appl. No.: 09/713,151

(22) Filed: Nov. 15, 2000

(51) Int. Cl.[7] ............................................... H01L 31/00
(52) U.S. Cl. ..................................... 250/214.1; 257/436
(58) Field of Search ..................... 250/214.1; 257/436, 257/291, 14, 19, 21, 98, 294, 432, 435

(56) References Cited

U.S. PATENT DOCUMENTS

| | | | | |
|---|---|---|---|---|
| 5,172,206 A | * | 12/1992 | Iizuka | 257/291 |
| 5,828,088 A | * | 10/1998 | Mauk | 136/259 |
| 6,111,266 A | * | 8/2000 | Carline et al. | 257/14 |
| 6,255,681 B1 | * | 7/2001 | Pan | 257/292 |

* cited by examiner

*Primary Examiner*—Stephone Allen
*Assistant Examiner*—Bradford Hill
(74) *Attorney, Agent, or Firm*—Steve Mendelsohn; Yuri Gruzdkov; Joe Zheng

(57) ABSTRACT

An image (or other light) sensor has a reflective element under each light-sensing element. The reflective element is positioned to reflect incident light that passes through the light-sensing element without being absorbed, back towards the light-sensing element for a second chance at being absorbed. The present invention increases the effective quantum efficiency of each light-sensing element without having to increase the thickness of the absorption region within the light-sensing element. In one embodiment, each reflective element is a discrete mirror that is positioned within the sensor packaging adjacent to (e.g., below) the integrated image sensor. In another embodiment, each reflective element is an integral part of the integrated circuit that contains the image sensor, such as a light-reflecting region formed within the substrate below the corresponding light-sensing element.

19 Claims, 3 Drawing Sheets

INTEGRATED LIGHT SENSORS WITH BACK REFLECTORS FOR INCREASED QUANTUM EFFICIENCY

BACKGROUND OF THE INVENTION

1. Field of the Invention

The present invention relates to integrated sensors, such as CMOS image sensors.

2. Description of the Related Art

CMOS image sensors suffer from the problem that, with an indirect band-gap, a relatively thick absorption region is often needed to achieve the desired quantum efficiency (defined as the ratio of the number of collected photo-electrons (or photo-holes) to the number of incident photons). Unfortunately, at deep sub-micron technologies, the absorption regions often cannot be made thick enough, especially for longer wavelength light.

FIG. 1 is a cross-sectional view illustrating part of an image sensor according to the prior art. As shown in FIG. 1, incident light 102 enters at one side of a light-sensing element (represented as absorption region 100), within which some of the incident light is absorbed at locations 104 and the remaining light 106 exits at the opposite side. Absorption region 100 could correspond to an epi layer on the front side of a silicon wafer, where a photodiode is formed within the epi layer. Since silicon is an indirect band-gap material, the absorption coefficient of visible light in the range of 400–700 nanometers in silicon is relatively low.

One way to increase the quantum efficiency of the light-sensing element is to make absorption region 100 thicker in order to absorb a greater percentage of the incident light. For example, at a wavelength of 700 nanometers, an epi layer thickness of about 15 microns would absorb about 99% of incident photons. For longer wavelengths important in optical communications (such as the near IR, where wavelengths can extend to 1 micron), the absorption region of the light-sensing element must be made even thicker to achieve the same quantum efficiency. Unfortunately, this technique cannot be applied in deep sub-micron technologies, where the absorption regions often cannot be made thick enough to achieve the desired quantum efficiency.

SUMMARY OF THE INVENTION

According to the present invention, one or more reflective elements are positioned below the absorption regions of light-sensing elements in image sensors and the like. In these devices, light that passes through the absorption region of a light-sensing element without being absorbed is reflected by a corresponding reflective element back towards the absorption region, such that the reflected light enters the absorption region a second time, giving those reflected photons a second chance at being absorbed and thereby increasing the effective quantum efficiency of the light-sensing element. In this way, the present invention provides a technique for improving quantum efficiency without having to increase the thickness of the absorption region. As such, more efficient image sensors can be implemented, including those implemented using deep sub-micron technologies.

According to one embodiment, the present invention is a light sensor comprising (a) a light-sensing element formed on a substrate, the light-sensing element designed to generate an electrical signal in response to incident light absorbed within the light-sensing element; and (b) a light-reflecting element positioned in relation to the light-sensing element to reflect light transmitted through the light-sensing element back towards the light-sensing element to increase an effective quantum efficiency of the light-sensing element.

According to another embodiment, the present invention is a method comprising the steps of (a) forming a light-sensing element on a substrate, the light-sensing element designed to generate an electrical signal when incident light is absorbed therein; and (b) positioning a light-reflecting element in relation to the light-sensing element to reflect light transmitted through the light-sensing element back towards the light-sensing element to increase an effective quantum efficiency of the light-sensing element.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. The description herein is largely based on a particular image sensor based on digital pixel sensor architecture. Those skilled in the art can appreciate that the description can be equally applied to other image and light sensors.

According to the present invention, a reflective surface or other light-reflecting element is positioned to reflect light that passes through a light-sensing element, back towards the light-sensing element to increase the effective quantum efficiency of the light-sensing element. The following two sections provide descriptions of just two of the possible embodiments of the present invention.

A. Mirror Under Substrate

In one embodiment of the present invention, one or more mirrors are positioned under a substrate having one or more light-sensing elements, where each mirror is positioned relative to a corresponding light-sensing element. Light that passes through a light-sensing element without being absorbed strikes the corresponding mirror and is reflected back towards the light-sensing element, where it has a second chance at being absorbed.

Figure 1:
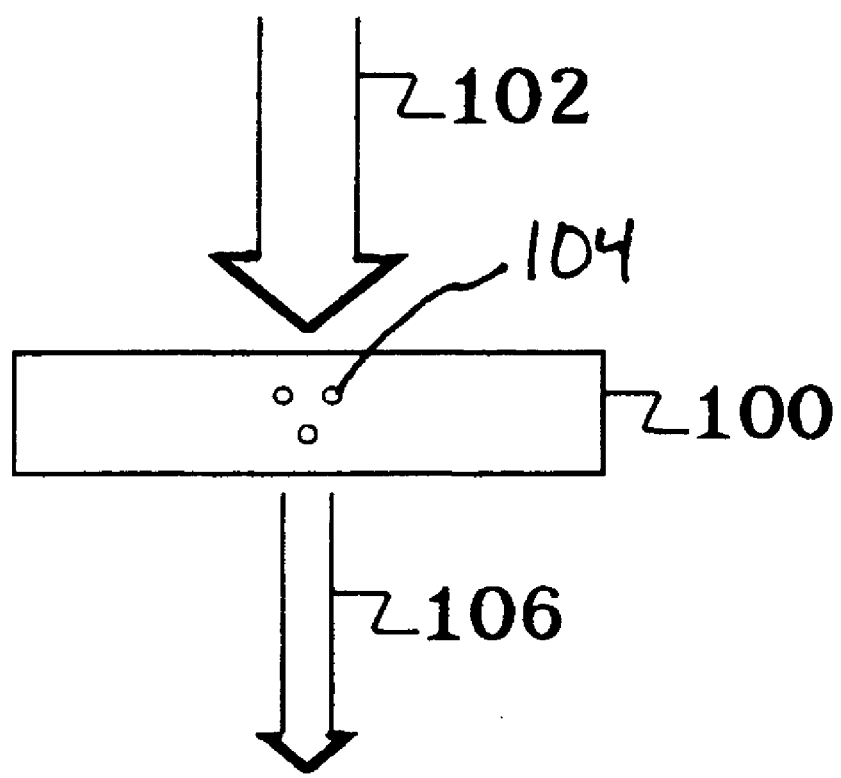
FIG. 1 is a cross-sectional view illustrating part of an image sensor according to the prior art.
Figure 2:
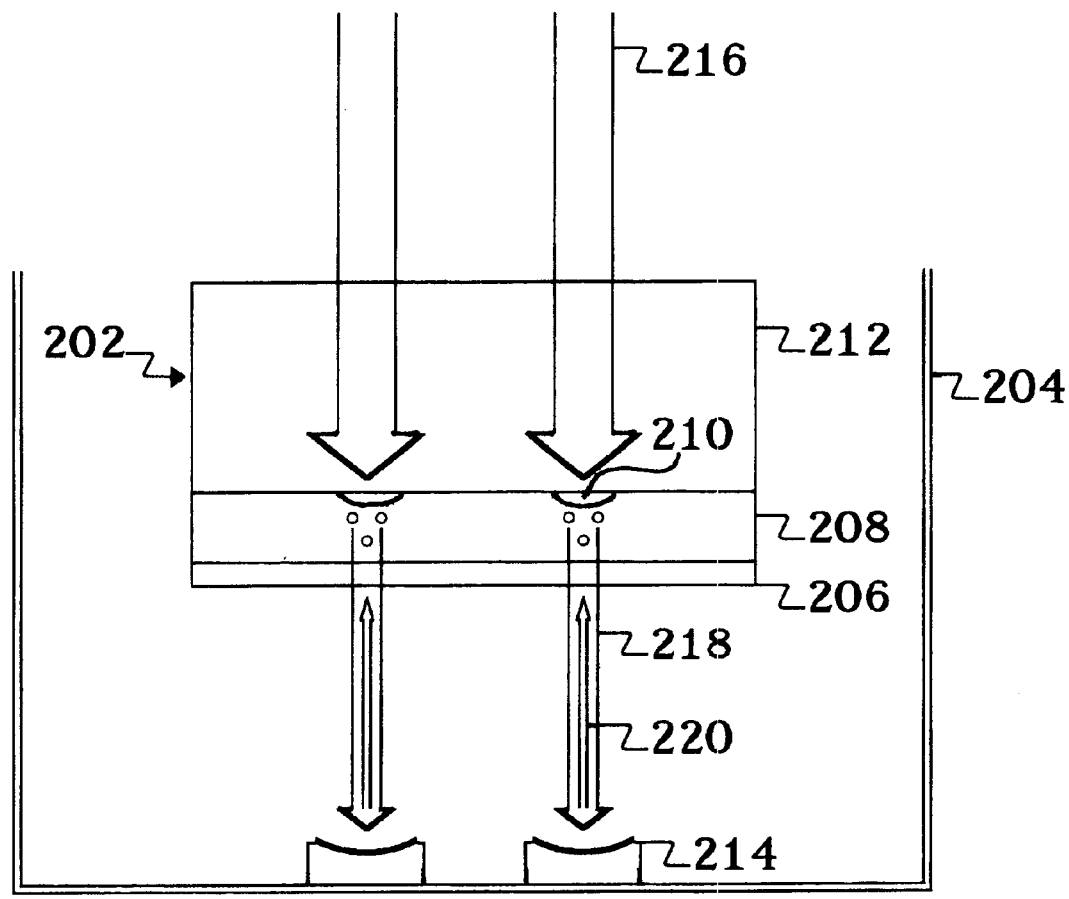
FIG. 2 is a cross-sectional view illustrating part of an image sensor according to one embodiment of the present invention.

FIG. 2 shows a cross-sectional view illustrating part of an imaging device 200, according to one embodiment of the present invention. Imaging device 200 comprises an integrated CMOS image sensor 202 mounted in device packaging 204. For illustrative purposes, FIG. 2 shows only two of the light-sensing elements of image sensor 202.

Image sensor 202 comprises a semiconductor substrate 206 with an epi layer 208 formed over substrate 206. For each light-sensing element of image sensor 202, a photodiode 210 is formed near the top surface of epi layer 208. In addition, a set 212 of dielectric and conductive layers formed over epi layer 208 provide the circuitry for reading the electrical signals from each of the light-sensing elements.

Mirrors 214 or other suitable discrete light-reflecting elements are mounted within device packaging 204 below image sensor 202 and individually aligned with the various photodiodes of the light-sensing elements.

In operation, incident light 216 passes through layers 212 and impinges upon epi layer 208, within which some fraction of the incident photons are absorbed, generating electron-hole pairs. Some if not most of these photo-electrons (or photo-holes) are collected at a corresponding photodiode 210. Light that is not absorbed within epi layer 208 passes through substrate 206 as transmitted light 218, which is then reflected by the corresponding mirror 214 as reflected light 220 back through substrate 206, and impinges upon epi layer 208, where again some fraction of the reflected photons are absorbed, generating additional electron-hole pairs. As before, some if not most of these photo-electrons (or photo-holes) are collected at the corresponding photodiode 210. As a result, the number of the photons in the original incident light 216 that eventually get absorbed within epi layer 208 and generate photo-electrons (or photo-holes) that get collected will be greater than for an analogous prior art sensor that does not provide the back-reflection provided by mirrors 214. In this way, the quantum efficiency of imaging device 200 is greater than that of a comparable prior art device (i.e., a prior art device having a light-absorption region of the same thickness).

In one particular implementation of imaging device 200, substrate 206 is made from a silicon wafer, layer 208 is a P–epi layer having a doping concentration between about $10^{13}$ and about $10^{15}$ atoms/cm$^3$ and a thickness of about 5 to 8 microns, and each photodiode 210 is an N+ diffusion region having an N+ doping concentration between about $10^{17}$ and about $10^{20}$ atoms/cm$^3$ and a depth between about 0.2 and 0.5 microns. During fabrication, substrate 206 is preferably thinned to about 1 micron in order to decrease the absorption of photons as the transmitted and reflected light passes through substrate 206.

Each mirror 214 can be any suitable element that reflects electromagnetic radiation having a wavelength within the range for which the image sensor is designed. In a preferred implementation, each mirror 214 has a curved (e.g., parabolic shaped) surface that focuses the reflected light towards the appropriate light-sensing element. In an alternative implementation, a, single large mirror or other light-reflecting surface may be used instead of a plurality of mirrors individually aligned with the various photodiodes.

B. Reflective Region Within Substrate

In another embodiment of the present invention, the light-reflecting element corresponding to each light-sensing element is formed as an integral part of the integrated circuit that contains the image sensor. For example, each light-reflecting element may be a light-reflecting oxide region formed within the substrate below the corresponding light-sensing element.

Figure 3:
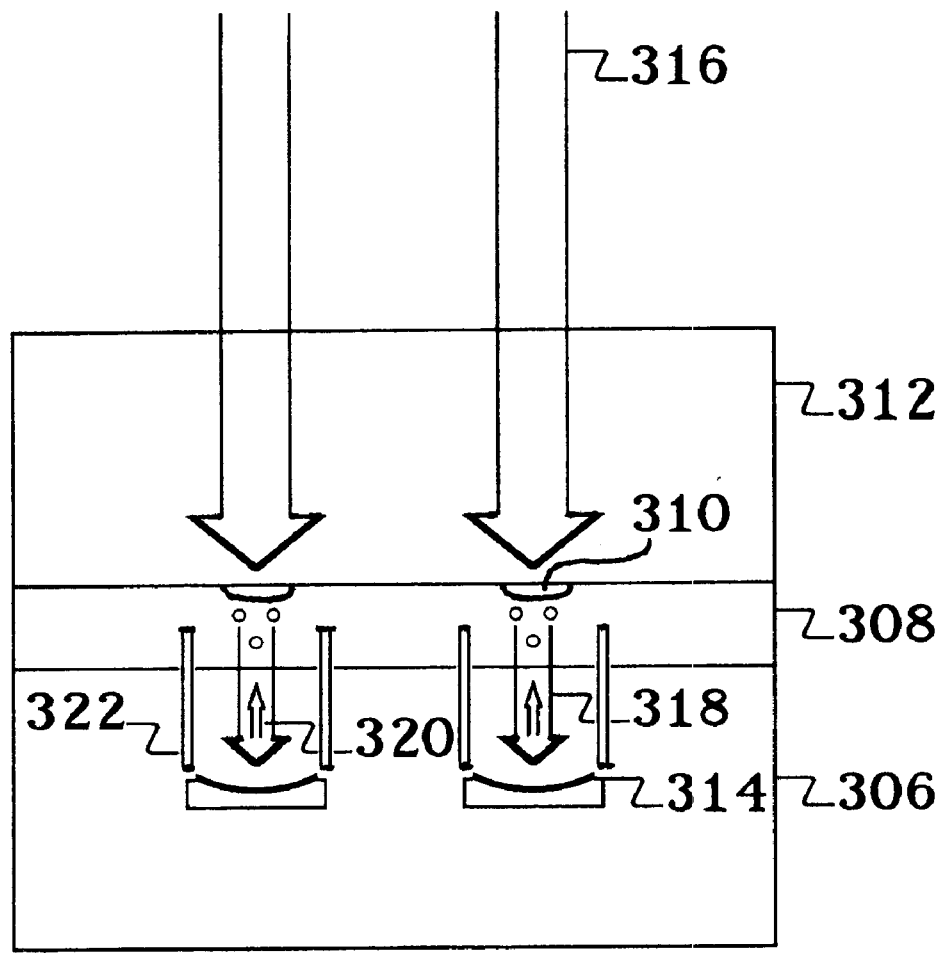
FIG. 3 is a cross-sectional view illustrating part of an image sensor according to another embodiment of the present invention.

FIG. 3 shows a cross-sectional view illustrating part of an integrated CMOS image sensor 302, according to another embodiment of the present invention. For illustrative purposes, FIG. 3 shows only two of the light-sensing elements of image sensor 302.

Image sensor 302 comprises a semiconductor substrate 306 with an epi layer 308 formed over substrate 306. For each light-sensing element of image sensor 302, a photodiode 310 is formed near the top surface of epi layer 308. In addition, a set 312 of dielectric and conductive layers formed over epi layer 308 provide tile circuitry for reading the electrical signals from each of the light-sensing elements.

A light-reflecting region 314 is formed within substrate 306 below the photodiode 310 of each light-sensing element.

In operation, incident light 316 passes through layers 312 and impinges upon epi layer 308, where some fraction of the incident photons are absorbed, generating electron-hole pairs, where some if not most of the resulting photo-electrons (or photo-holes) are collected at a corresponding photodiode 310. Light that is not absorbed within epi layer 308 passes into substrate 306 as transmitted light 318, which is reflected by the corresponding light-reflecting region 314 as reflected light 320 back through substrate 306, and impinges upon epi layer 308, where again some fraction of the reflected photons are absorbed, generating additional electron-hole pairs and some if not most of the photo-electrons (or photo-holes) are collected at the corresponding photodiode 310. As a result, the number of the photons in the original incident light 316 that eventually get absorbed within epi layer 308 and generate photo-electrons (or photo-holes) that get collected will be greater than for an analogous prior art sensor that does not provide light-reflecting elements. In this way, the quantum efficiency of image sensor 302 is greater than that of a comparable prior art device (i.e., a prior art device having a light-absorption region of the same thickness).

In one particular implementation of image sensor 302, substrate 306 is made from a silicon wafer, layer 308 is a P–epi layer having a doping concentration between about $10^{13}$ and about $10^{15}$ atoms/cm$^3$ and a thickness of about 5 to 8 microns, and each photodiode 310 is an N+ diffusion region having an N+ doping concentration between about $10^{17}$ and about $10^{20}$ atoms/cm$^3$ and a depth between about 0.2 and 0.5 Å.

Each light-reflecting region 314 formed within substrate 306 is made of a suitable material, such as a silicon oxide, a silicon oxynitride, or a silicon nitride, that reflects radiation of the appropriate wavelength. For example, silicon oxide regions can be formed by an oxygen ion implant followed by annealing. The light-reflecting regions may be flat or curved to focus the reflected light back towards the appropriate light-sensing element. Curved regions may be formed using a special implant process such as an angled implant or by implanting such that the material is thicker at the perimeter than at the center.

In particular implementations, light-reflecting vertical via structures 322 may be formed within epi layer 308 and/or within substrate 306 below each photodiode 310 and above each light-reflecting region 314. Such structures will help direct reflected light back towards the appropriate light-sensing element, while helping to block stray light corresponding to other light-sensing elements. With the addition of light-reflecting vertical via structures 322, the various light-reflecting regions 314 may be implemented as a single light-reflecting layer as opposed to different individual regions.

As used in this specification, the term "light" refers to any suitable electromagnetic radiation in any wavelength and is not necessarily limited to visible light.

In general, the substrates used in the imaging devices of the present invention may be made of any suitable semiconductor material, such as Si or InGaAs, with wells of different dopant types to form various structures. Each light-sensing element may be based on any suitable light-sensitive device, such as, for example, a photodiode, a photo-transistor, a photo-gate, photo-conductor, a charge-coupled device, a charge-transfer device, or a charge-injection device, formed at an appropriate location on or within the substrate. In the particular implementations of FIGS. 2 and 3, each light-sensing element has a photodiode formed from a well within an epi layer. In some alternative implementations, each light-sensing element may comprise a structure grown on top of the front side of the substrate (as opposed to a structure such as a well formed within the substrate or within an epi layer formed on top of the substrate).

Although the present invention has been described in the context of light-sensing elements for image sensors, it will be understood that the present invention can be implemented for regions of the electromagnetic spectrum outside of the visible light range. Similarly, although the present invention has been described in the context of image sensors implemented using digital pixel sensor (DPS) elements, it will be understood that the present invention can also be applied to other applications, including image sensors implemented with light-sensing elements other than DPS elements, such as analog pixel sensor (APS) elements and charge-coupled device (CCD) elements.

In general, the present invention may be implemented for image sensors having one or more light-sensing elements arranged in either a one- or two-dimensional pattern, such as an array of elements arranged in rows and columns. The light-sensing elements within a given sensor array as well as the corresponding light-reflecting elements may have the same or different areas and/or shapes, including squares, rectangles, or circles.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the principle and scope of the invention as expressed in the following claims. Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. A light sensor comprising:
   a light-sensing element formed on a substrate, the light-sensing element designed to generate an electrical signal in response to incident light absorbed within the light-sensing element; and
   a light-reflecting element positioned in relation to the light-sensing element to reflect light transmitted through the light-sensing element back towards the light-sensing element to increase an effective quantum efficiency of the light-sensing element, wherein:
   the light-reflecting element is an integrated light-reflecting region formed on or within the substrate; and
   the substrate comprises silicon and the light-reflecting region comprises a silicon oxide, wherein light is reflected from an interface between the silicon and the silicon oxide; and
   wherein an integrated light-reflecting vertical via structure formed between the light-sensing element and the light-reflecting region to help direct the reflected light back towards the light-sensing element, while helping to block stray light corresponding to other light-sensing elements in the sensor.

2. The light sensor of claim 1, wherein the substrate has a plurality of light-sensing elements, each having a corresponding light-reflecting element.

3. The light sensor of claim 1, wherein the light-sensing element comprises a photodiode formed within an epi layer formed on the substrate.

4. The light sensor of claim 1, wherein the light-reflecting element has a curved shape that focuses the reflected light towards the light-sensing element.

5. The light sensor of claim 1, wherein:
   the substrate has a plurality of light-sensing elements, each having a corresponding light-reflecting element; and
   the light-sensing element comprises a photodiode formed within an epi layer formed on the substrate.

6. A method comprising:
   forming a light-sensing element on a substrate, the light-sensing element designed to generate an electrical signal when incident light is absorbed therein; and
   positioning a light-reflecting element in relation to the light-sensing element to reflect light transmitted through the light-sensing element back towards the light-sensing element to increase an effective quantum efficiency of the light-sensing element, wherein:
   the light-reflecting element is an integrated light-reflecting region formed on or within the substrate; and
   the substrate comprises silicon and the light-reflecting region comprises a silicon oxide, wherein light is reflected from an interface between the silicon and the silicon oxide; and
   forming an integrated light-reflecting vertical via structure between the light-sensing element and the light-reflecting region to help direct the reflected light back towards the light-sensing element, while helping to block stray light corresponding to other light-sensing elements in the sensor.

7. The method of claim 6, wherein the substrate has a plurality of light-sensing elements, each having a corresponding light-reflecting element.

8. The method of claim 6, wherein the light-sensing element comprises a photodiode formed within an epi layer formed on the substrate.

9. The method of claim 6, wherein the light-reflecting element has a curved shape that focuses the reflected light towards the light-sensing element.

10. The method of claim 6, wherein:
    the substrate has a plurality of light-sensing elements, each having a corresponding light-reflecting element; and
    the light-sensing element comprises a photodiode formed within an epi layer formed on the substrate.

11. A light sensor comprising:
    (a) a light-sensing element formed on a substrate, the light-sensing element designed to generate an electrical signal in response to incident light absorbed within the light-sensing element; and
    (b) a light-reflecting element positioned in relation to the light-sensing element to reflect light transmitted through the light-sensing element back towards the light-sensing element to increase an effective quantum efficiency of the light-sensing element, wherein the light-reflecting element comprises a mirror distinct from the substrate and positioned adjacent to the substrate within packaging for the sensor.

12. The light sensor of claim 11, wherein the light-reflecting element has a curved shape that focuses the reflected light towards the light-sensing element.

13. The light sensor of claim 11, further comprising an integrated light-reflecting via structure with vertical walls formed between the light-sensing element and the light-reflecting element to help direct the reflected light back towards the light-sensing element, while helping to block stray light corresponding to other light-sensing elements in the sensor.

14. A light sensor comprising:

a light-sensing element formed on a substrate, the light-sensing element designed to generate an electrical signal in response to incident light absorbed within the light-sensing element; and a light-reflecting element positioned below the light-sensing element to reflect light transmitted through the light-sensing element back towards the light-sensing element to increase an effective quantum efficiency of the light-sensing element, wherein the light-reflecting element has a curved shape that focuses the reflected light towards the light-sensing element; and an integrated light-reflecting via structure with vertical walls formed between the light-sensing element and the light-reflecting element to help direct the reflected light back towards the light-sensing element, while helping to block stray light corresponding to other light-sensing elements in the sensor.

15. The light sensor of claim 14, wherein:

the light-reflecting element is an integrated light-reflecting region formed on or within the substrate; and the substrate comprises silicon and the light-reflecting region comprises a silicon oxide, wherein light is reflected from an interface between the silicon and the silicon oxide.

16. A light sensor comprising:

(a) a light-sensing element formed on a substrate, the light-sensing element designed to generate an electrical signal in response to incident light absorbed within the light-sensing element;

(b) a light-reflecting element positioned in relation to the light-sensing element to reflect light transmitted through the light-sensing element back towards the light-sensing element to increase an effective quantum efficiency of the light-sensing element; and (c) an integrated light-reflecting via structure distinct from the light-reflecting element, the via structure having vertical walls formed between the light-sensing element and the light-reflecting element to help direct the reflected light back towards the light-sensing element, while helping to block stray light corresponding to other light-sensing elements in the sensor.

17. The light sensor of claim 16, wherein:

the light-reflecting element is an integrated light-reflecting region formed on or within the substrate; and the substrate comprises silicon and the light-reflecting region comprises a silicon oxide, wherein light is reflected from an interface between the silicon and the silicon oxide.

18. The light sensor of claim 16, wherein the light-reflecting element has a curved shape that focuses the reflected light towards the light-sensing element.

19. The light sensor of claim 16, wherein the light-reflecting element is a mirror distinct from the substrate and positioned adjacent to the substrate within packaging for the sensor.

* * * * *